United States Patent [19]
Cox et al.

[11] Patent Number: 5,644,452
[45] Date of Patent: Jul. 1, 1997

[54] APPARATUS CONNECTING A FLEXIBLE CIRCUIT TO AN ACTUATOR ARM OF A DISC DRIVE

[75] Inventors: Alvin E. Cox, Yukon; Steven S. Eckerd; David S. Allsup, both of Oklahoma City; Mark S. Maggio, Bethany, all of Okla.

[73] Assignee: Seagate Technology, Inc., Scotts Velley, Calif.

[21] Appl. No.: 494,009

[22] Filed: Jun. 23, 1995

Related U.S. Application Data

[63] Continuation of Ser. No. 228,665, Apr. 18, 1994, abandoned.
[51] Int. Cl.⁶ .......................... G11B 21/08; G11B 25/04; H05K 1/00
[52] U.S. Cl. .................. 360/106; 360/97.01; 360/108; 361/749; 439/67
[58] Field of Search ...................... 360/106, 104, 360/105, 108, 97.01, 98.01, 99.01, 86; 369/222, 244, 250; 361/749; 439/67, 77, 452, 457

[56] References Cited

U.S. PATENT DOCUMENTS

| | | | |
|---|---|---|---|
| 3,696,319 | 10/1972 | Olsson | 439/77 |
| 4,567,543 | 1/1986 | Miniet | 361/398 |
| 4,645,280 | 2/1987 | Gordon et al. | 360/104 |
| 4,894,015 | 1/1990 | Stockero et al. | 439/67 |
| 5,012,368 | 4/1991 | Sendoda | 360/104 |
| 5,030,113 | 7/1991 | Wilson | 439/80 |
| 5,095,396 | 3/1992 | Putnam et al. | 360/106 |
| 5,103,359 | 4/1992 | Marazzo | 360/104 |
| 5,121,273 | 6/1992 | Slezak | 360/104 |
| 5,122,703 | 6/1992 | Takahashi et al. | 360/107 |
| 5,140,482 | 8/1992 | Kimura et al. | 360/104 |
| 5,166,846 | 11/1992 | Shigemoto | 360/104 |
| 5,241,454 | 8/1993 | Ameen et al. | 361/744 |
| 5,392,179 | 2/1995 | Bosier et al. | 360/104 |
| 5,404,636 | 4/1995 | Stefansky et al. | 29/603 |
| 5,422,764 | 6/1995 | McIlvanie | 360/106 |
| 5,495,377 | 2/1996 | Kim | 360/106 |
| 5,573,409 | 11/1996 | Shiley et al. | 439/67 |

FOREIGN PATENT DOCUMENTS

| | | | |
|---|---|---|---|
| 59-168968 | 9/1984 | Japan | 360/104 |
| 4-069803 | 3/1992 | Japan | 360/104 |
| 6-084151 | 3/1994 | Japan | 360/104 |
| 2212971 | 8/1989 | United Kingdom | 360/106 |
| WO93/14495 | 7/1993 | WIPO | 360/104 |

*Primary Examiner*—Stuart S. Levy
*Assistant Examiner*—Craig A. Renner
*Attorney, Agent, or Firm*—Kinney & Lange, P.A.

[57] ABSTRACT

An apparatus connects a flexible circuit to an actuator arm of a disc drive. The actuator arm supports a transducer head assembly, and the flexible circuit includes an electrical circuit supporting structure supporting a first electrical circuit coupled to the transducing head assembly. The apparatus comprises a solder joint. In one embodiment, the solder joint comprises a pin, respective first and second pin receiving holes in the actuator arm and supporting structure, and a solder connection between the pin and the supporting structure. Connecting the flexible circuit to the actuator arm entails inserting the pin through the second pin receiving hole, press-fitting the pin into the first pin receiving hole, and soldering it to the supporting structure. Another embodiment includes a solder connection between a ground plane on the supporting structure and the pin.

22 Claims, 2 Drawing Sheets

5,644,452

APPARATUS CONNECTING A FLEXIBLE CIRCUIT TO AN ACTUATOR ARM OF A DISC DRIVE

This is a continuation of application Ser. No. 08/228,665, filed Apr. 18, 1994, now abandoned.

BACKGROUND OF THE INVENTION

The present invention relates to actuator support structures for use in disc drive data storage systems. More specifically, the present invention relates to an attachment between a flex lead or other electrical circuit supporting structures and an actuator arm.

Rotating disc drive data storage systems include one or more discs which may be rotated about a vertical spindle axis. Each disc typically has a plurality of concentric tracks on one or both disc surfaces from which information is read or onto which information is written by means of reading and/or writing transducer head assemblies. A plurality of support arms form a configuration known in the art as an "E-block", "rotary arm", or "actuator arm". A first end of each support arm is attached to and supports at least one magnetic head carrying arm and a corresponding transducer head assembly. Usually, each support arm is attached to two magnetic head carrying arms configured such that a transducer head assembly is positioned adjacent to each disc surface in the data storage system. A second end of each support arm is connected to a central portion of the rotary arm, wherein lies the axis of rotation of the rotary arm. An actuator coil provides the necessary torque to rotate the arm about this axis to move the transducer head assemblies over the magnetic discs to desired track locations.

As the transducer head assemblies read information from or write information to the tracks of the magnetic discs, electrical signals are transferred between the transducer head assemblies and an electrical circuit which may be positioned remote from the rotary arm. Because of the dynamic movement of the rotary arm, a flexible circuit, known as a flex, a flex cable or a flex lead, is used for transferring the electrical signals to and/or from the transducer head assemblies. The flex cable is typically a multi-layer cable made of plastic or other readily available flexible materials with thin copper runs included for carrying signals. The flex cable may simply be used as a circuit for carrying signals from the transducer head assemblies to an external circuit. However, the flex cable can also support external circuit components which may be wire bonded onto the flex cable itself.

As disc drive data storage systems continue to reduce in size, available space for attachment of flex leads to the rotary arm is reduced as well. Additionally, new magnetoresistive (MR) transducer head assembly designs require additional wires or electrical connections for each transducer head assembly. This in turn requires a more dense layout of the flex cable to accommodate the additional runs necessary. Consequently, room for attachment of the flex cable to the arm is becoming increasingly small.

Previously, a screw was used to attach the flex cable to the rotary arm. Mounting flex cables or other electrical circuit supporting structures such as circuit boards to the rotary arm with a screw has several disadvantages. First, mounting the flex cable to the rotary arm introduces certain manufacturing and assembly difficulties. As stated above, space on the flex cable for mounting to the rotary arm is very limited. Therefore, the screw itself must be very small. Use of a screw requires that a tapped hole be placed in the rotary arm for receiving the screw. Also, the designs of many rotary arms provide very limited access for driving the screw into the rotary arm with a screw driver. The small size of the hardware, the limited vertical access, and the requirement that a tapped hole be placed in the rotary arm all provide obvious manufacturing difficulties.

Another disadvantage of using a screw to secure the flex cable or other electrical supporting structures to the rotary arm relates to grounding of the rotary arm assembly. One known method of grounding the rotary arm assembly, grounding the rotary arm through the bearings of the spindle, results in intermittent grounding. The intermittent grounding is a result of intermittent contact between the bearings and the rotary arm caused by obstructions such as grease on the bearings. A non-grounded or intermittently grounded rotary arm assembly can result in increased noise in the electrical signals communicated or processed between the transducer head assemblies and an external circuit.

Another method of grounding the rotary arm assembly uses the screw which mounts the flex cable to the rotary arm to provide an electrical ground connection from a ground run on the flex cable. However, this method of grounding the rotary arm assembly has disadvantages as well. Subjecting the rotary arm to variations in temperature can result in the screw loosening. As the screw loosens, the ground connection can be lost. Consequently, current methods of attaching the flexible cable to the rotary arm and of grounding the rotary arm are less than ideal.

SUMMARY OF THE INVENTION

The present invention is an actuator support structure for use in a disc drive data storage system. The actuator support structure includes an actuator arm for supporting a transducer head assembly, an electrical circuit supporting structure positioned adjacent to the actuator arm, and a solder joint for securing the electrical circuit supporting structure to the actuator arm. The electrical circuit supporting structure supports a first electrical circuit for electrically communicating with a transducer head assembly.

In preferred embodiments of the present invention, the rotary arm includes a first pin receiving hole in which a solderable pin is inserted. A second pin receiving hole is included in the electrical circuit supporting structure, the second pin receiving hole being alignable with the first pin receiving hole and the pin such that the pin extends through the second pin receiving hole. The solder joint comprises a solder connection between the pin and the electrical circuit supporting structure. In preferred embodiments, the solder joint also provides an electrical connection to a ground reference on the electrical circuit supporting structure for grounding the rotary arm.

In some preferred embodiments, the electrical circuit supporting structure includes a flexible material which supports the first electrical circuit. However, in other embodiments, the electrical circuit supporting structure includes a substrate on which the first electrical circuit is mounted. The first electrical circuit may simply be electrical runs or connections for carrying signals, it may be a preamp circuit for amplifying electrical signals from the transducer head assembly, or it may be any of a number of other types of electrical circuits.

DETAILED DESCRIPTION OF THE PREFERRED EMBODIMENTS

Figure 1:
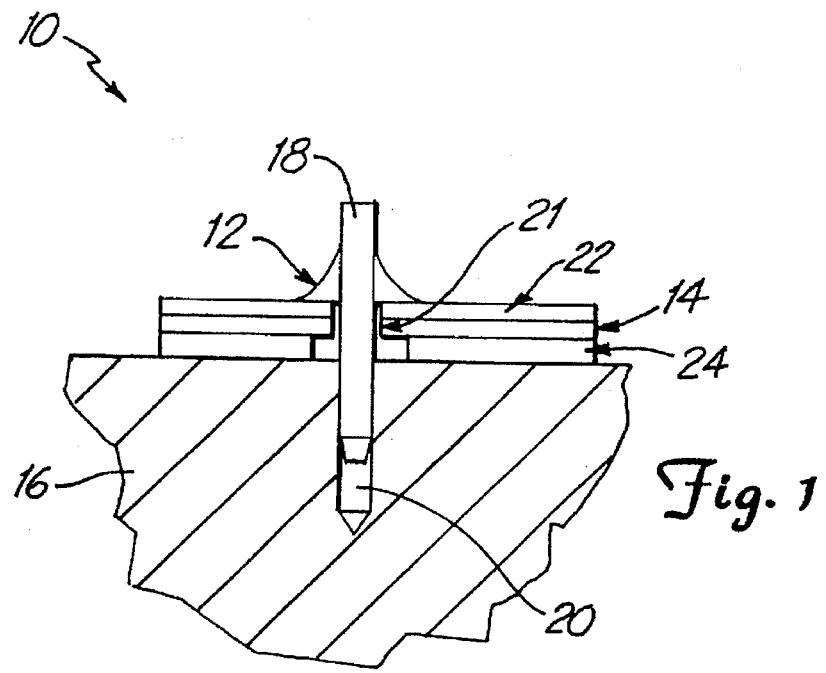
FIG. 1 is a side diagrammatic view illustrating a flex cable secured to a rotary arm with a solder joint attachment in accordance with one preferred embodiment of the present invention.

FIG. 1 is a side diagrammatic view of flex lead attachment 10 for attaching a flexible cable to a rotary arm assembly in a disc drive data storage system. Flex lead attachment 10 utilizes one or more solder joints 12 to attach flex cable 14 to rotary arm or rotary arm assembly 16. Although arm 16 is described herein as a rotary arm, arm 16 can be other types of actuator arms or arm assemblies such as a linear actuator arm. Flex cable 14 can also be referred to as a flex, a flex lead, or a flexible circuit. Flex cable 14 is preferably made from a flexible plastic or other material which supports an electrical circuit. In preferred embodiments, flex cable 14 is made from one of these flexible electrical circuit supporting materials and forms a structure having a plurality of copper runs. The copper runs are used to provide electrical connections or circuits through which a plurality of transducer head assemblies mounted on rotary arm 16 communicate with an electrical circuit positioned either on flex cable 14 or positioned remote from rotary arm 16. Flex cable 14 can have a preamplifier or other electrical components or integrated circuits wire bonded directly onto it.

Each solder joint 12 includes a pin 18 inserted into hole 20 in rotary arm 16. Each hole 20 can be drilled into rotary arm 16 at a cost which is cheaper to produce than the tapped holes required to secure flex cable 14 to rotary arm 16 with a screw. Pin 18 is pressed into hole 20 in rotary arm 16. Flex cable 14 includes a guide hole 21 for receiving each pin 18 when flex cable 14 is properly aligned adjacent to rotary arm 16. Hole 21 is preferably larger in area than hole 20 so that pin 18 can easily fit through it. In preferred embodiments, a solder pad is placed around hole 21. After flex cable 14 is placed over pin 18, it can be soldered in place, thus securing flexible cable 14 to rotary arm 16.

The method shown in FIG. 1 of attaching flex cable 14 to rotary arm 16 with solder joint 12 provides numerous advantages over prior art methods which utilize a screw to achieve a similar attachment. First, if flex cable 14 is in need of replacement, it can be easily removed by heating solder joint 12 to desolder pin 18. A replacement flex cable can then be easily resoldered in its place.

Second, use of solder joint 12 to attach flexible cable 14 to rotary arm 16 provides numerous manufacturing advantages over prior art screw attachments. Machining tapped holes into rotary arm 16 is typically more expensive than drilling hole 20. Also, space limitations on flexible cable 14 make it necessary to use very small screws to attach the flexible cable to rotary arm assembly 16. Many rotary arm designs are such that vertical access for driving a screw into the tapped holes is very limited. From a manufacturing point of view, working with very small hardware in a limited space complicates the manufacturing process. Very small hardware can easily cross thread, resulting in loss of a high value added assembly.

Another advantage of utilizing solder joint 12 to attach flex cable 14 to rotary arm 16 is that more consistent grounding of rotary arm 16 can be accomplished than is possible through a screw attachment. A ground run 22 in flex cable 14 provides a ground reference through solder joint 12 and pin 18 to rotary arm 16. Solder joint 12 and the good fit between pin 18 and hole 20 result in a consistent ground reference for rotary arm 16. This in turn provides a reduction in noise induced in electrical signals transferred on the copper runs of flex cable 14 between the transducer head assemblies and a preamplifier or other circuit.

As discussed above, flex cable 14 can simply be a flexible circuit which supports copper runs on which electrical signals are communicated between transducer head assemblies and an externally located circuits such as a preamplifier. However, in other embodiments, flex cable 14 supports discrete electrical components to form a circuit with a function other than simply providing an electrical connection to a circuit located remote from rotary arm 16. These discrete electrical components can include, for example, resistors, capacitors and packaged integrated circuits such as preamplifiers. These components can be attached to flex cable 14 during assembly using a process, known as reflow, in which solder on flex cable 14 is heated so that it wicks to the discrete components.

Cable stiffener 24 can be included to provide a rigid surface to maintain the orientation and registration of flex cable 14. Cable stiffener 24 is typically attached to flex cable 14 with an adhesive. Attaching flex cable 14 to rotary arm 16 with solder joint 12 in accordance with preferred embodiments of the present invention is effectively secures cable stiffener 24 between flex cable 14 and rotary arm 16.

Figure 2:
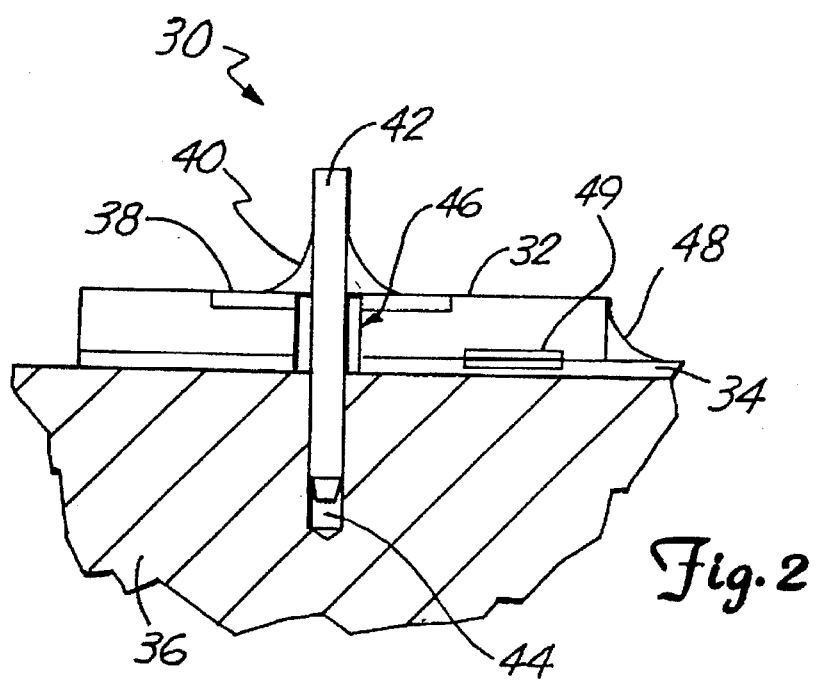
FIG. 2 is a side diagrammatic view illustrating a substrate secured to a rotary arm with a solder joint attachment in accordance with another preferred embodiment of the present invention.

FIG. 2 is a side diagrammatic view of substrate attachment 30 for attaching substrate 32 to rotary arm assembly 36 in a disc drive data storage system. Above discussions concerning solder connections, the pin, the rotary arm hole, the rotary arm, the flex cable, and the guide hole are intended to be applicable to the embodiments shown in FIGS. 2 and 3, but are not repeated with as much detail in the following discussions. In the preferred embodiment shown in FIG. 2, substrate 32 contains ground run 38 which is connected to pin 42 by solder joint 40. Pin 42 is inserted into hole 44 to attach substrate 32 to rotary arm 36 with the help of solder joint 40. Pin 42 extends through guide holes 46 in substrate 32 and flex cable 34.

Flex cable 34 is attached to substrate 32 preferably with either an adhesive layer or a solder connection. The solder connection can be a solder build-up 48 between an edge of substrate 32 and flex cable 34, it can be a solder connection 49 between adjacent solder pads on substrate 32 and flex cable 34, or it can be both types of solder attachments used simultaneously. In some preferred embodiments, substrate 32 contains supporting electrical circuitry instead of flex cable 34 as described in FIG. 1. This preferred embodiment illustrates how substrate 32 is utilized as the primary circuit with flex cable 34 used as a transmission line of processed signals.

Figure 3:
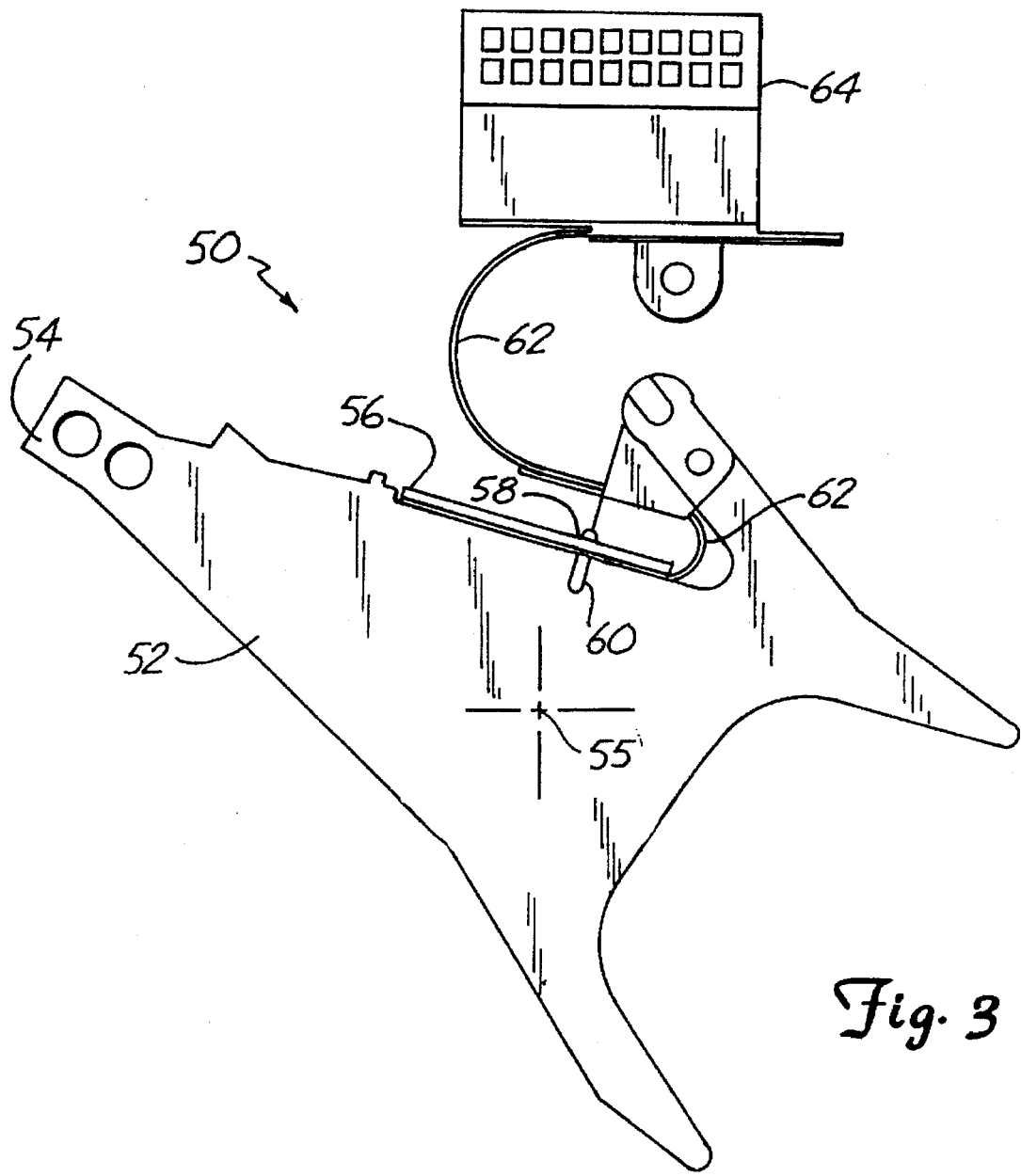
FIG. 3 is a top diagrammatic view illustrating a substrate containing a preamp secured to a rotary arm with a solder joint attachment in accordance with a second preferred embodiment of the present invention.

FIG. 3 is a diagrammatic view of an actuator support structure or assembly 50 having a substrate secured to a rotary arm with a solder joint attachment in accordance with the preferred embodiment shown in FIG. 2. Actuator support structure 50 includes rotary arm 52, which contains pivot point 55, substrate 56, solder joint 58, pin 60, flexible cable or circuit 62, and flex connector 64. As was the case with reference to FIGS. 1 and 2, arm 52 need not be a rotary arm, but rather, it can be any type of actuator arm or actuator arm assembly.

Each support arm of rotary arm 52 supports one or more transducer head assemblies at first end 54. In preferred embodiments, substrate 56 is a ceramic substrate circuit board on which a preamplifier die may be mounted by wire bonding and encapsulating the die and wire bonds. Substrate 56 preferably includes head flex terminations, signal crossing/distribution, and vias with pads to allow the substrate to be soldered to one or more pins 60 which have been press fit into rotary arm 52. It should be noted that, while in preferred embodiments substrate 56 is a ceramic substrate on which a preamplifier may be mounted, substrate 56 can be fabricated from any other electrical circuit supporting material or structure for supporting an electrical circuit which provides electrical communication with the plurality of transducer head assemblies supported by rotary arm 52.

As is the case in the embodiment shown in FIGS. 1 and 2, the electrical circuit supporting structure, in this case substrate 56, is attached to rotary arm 52 by a solder joint 58. Solder joint 58 once again includes a pin 60 inserted into rotary arm 52. As discussed in reference to FIG. 2, the flex cable 62 need not be soldered to rotary arm 52. Instead, flex cable 62 may be attached to substrate 56 by independent solder attachment as illustrated in FIG. 2. Attachment of substrate 56 to rotary arm 52 with solder joint 58 then results in attachment of flex cable 62 to rotary arm 52 as well. Flex cable 62 carries signals from the preamplifier or other circuits supported by substrate 56 to flex connector 64 for electrically communicating the signals to an external circuit.

Attachment of substrate 56 to rotary arm 52 by means of solder joint 58 provides the same advantages over screw attachments as flex lead attachment 10 shown in FIG. 1. As is the case with solder joint attachment 12, solder joint attachment 58 is significantly more manufacturable than a screw attachment. Additionally, ceramic substrate 56 can maintain relatively tight tolerances for holes through which pin 60 may be inserted for soldering. The tight hole tolerances can be maintained in ceramic substrate 56 for much lower costs than comparable tolerances maintained in flex cable 62.

Solder joint 58 also provides a means for grounding rotary arm 52. Solder pads on substrate 56 are connected to a ground run or path within the substrate. In this way, the ground path to rotary arm 52 can be made in close proximity to the preamp or electrical circuit mounted on substrate 56. This helps to further reduce noise in electrical signals.

Use of a substrate in the embodiments of the present invention shown in FIGS. 2 and 3 provides certain advantages over the use of a flexible cable without a substrate as was disclosed in the embodiment of FIG. 1. Some of these advantages are discussed below.

The rigidity of the substrate enhances assembly of the preamp to this electrical circuit supporting structure. A rigid substrate is particularly helpful when the bare preamp silicon (die) is mounted to the substrate. In this case, the signal pads on the nonpackaged die are connected to the electrical circuit pads on the substrate circuit through wire bonding. The variability of the wire bonding process reduces as the substrate pad rigidity approaches the rigidity of the die signal pads. Additional influences on the flex cable rigidity include the adhesives used and water absorption by the flex cable. This important improvement of reducing wire bond variance by using substrate 56 results in improved assembly yield.

The second advantage of using substrate 56 is the proximity that can be achieved between the preamp and its filtering components. The high operating frequency of the preamp makes its performance dependent upon the inductance and capacitance of supporting discrete capacitors and resistors. The connecting circuit runs between these discrete elements can impart a significant amount of inductance or capacitance which impacts the frequencies of the operating preamp. The substrate can be economically fabricated to have multilayers that allow optimization of the placement of these capacitors and resistors. It is less economical to use a multilayer flex cable.

Another advantage of using substrate 56 is reduced cost over the use of a flex cable. The multilayering cost of flex cable can be more than double the cost of some multilayer substrates due to unique processing steps required for the flex circuit. The assembled substrate can also be tested prior to the flex attachment. This subassembly testing places less material value at risk at the first preamplifier test. Finally, the bondable stiffener, which is used when the preamplifier die is attached to the flex cable without the use of a substrate, may be eliminated.

Another advantage of using substrate 56 is that an increase in reliability is recognized over the use of a flex cable without a substrate. When substrate 56 is a ceramic substrate, the thermal coefficients of expansion between the preamplifier die and the ceramic substrate are closely matched. This helps to maintain proper registration over extended temperature ranges.

Although the present invention has been described with reference to preferred embodiments, workers skilled in the art will recognize that changes may be made in form and detail without departing from the spirit and scope of the invention.

What is claimed is:

1. Apparatus connecting a flexible circuit to an actuator arm of a disc drive, the actuator arm supporting a transducer assembly, the flexible circuit including an electrical circuit supporting structure supporting a first electrical circuit coupled to the transducer assembly, the apparatus comprising:

a first pin receiving hole in the electrical circuit supporting structure;

a stiffening member composed of electrically insulating material, the stiffening member having a second pin receiving hole aligned with the first pin receiving hole and having a rigid surface abutting the electrical circuit supporting structure to stiffen the electrical circuit supporting structure;

a pin supported by the actuator arm and extending through the first and second pin receiving holes; and a solder connection between the pin and one of the electrical circuit supporting structure and the stiffening member, the solder connection mechanically securing and electrically connecting the pin to the one of the electrical circuit supporting structure and the stiffening member.

2. The apparatus of claim 1 wherein the stiffening member has a surface opposite the rigid surface, and wherein the solder connection is between the pin and the surface opposite the rigid surface of the stiffening member.

3. The apparatus of claim 1, wherein the first pin receiving hole has a smaller area than the second pin receiving hole.

4. The apparatus of claim 1, wherein the electrical circuit supporting structure includes a flexible material which supports the first electrical circuit.

5. The apparatus of claim 4, wherein the first electrical circuit includes copper runs contained within the flexible material.

6. The apparatus of claim 5 further comprising a second electrical circuit remote from the actuator arm, the first electrical circuit being coupled to the second electrical circuit to provide electrical communication between the transducer assembly and the second electrical circuit.

7. The apparatus of claim 5, wherein the first electrical circuit further includes electrical circuit components attached to an external surface of the flexible material.

8. The apparatus at claim 1 wherein the stiffening member has a surface opposite the rigid surface and abutting the actuator arm, and wherein the solder connection is between the pin and the electrical circuit supporting structure.

9. The apparatus of claim 1, wherein the first electrical circuit is a preamp circuit for amplifying electrical signals from the transducer assembly.

10. The apparatus of claim 1, wherein the solder connection electrically couples to a ground reference on the stiffening member, for grounding the actuator arm.

11. The apparatus of claim 1, wherein the electrically insulating material is ceramic based.

12. The apparatus of claim 1, wherein the electrically insulating material is epoxy based.

13. The apparatus of claim 1, wherein the flexible circuit is electrically coupled between the transducer assembly and a second electrical circuit remote from the actuator arm.

14. In a flexible circuit assembly having a conductive pin extending from an actuator arm through a first pin-receiving hole in a flexible circuit, the improvement comprising:

stiffening means, composed of electrically insulating material, for stiffening the flexible circuit maintaining orientation of the flexible circuit relative to the actuator arm, the stiffening means having an abutting surface abutting the flexible circuit, a non-abutting surface substantially parallel to the abutting surface, a second pin-receiving hole through which the conductive pin extends, and a conductor on the non-abutting surface adjacent the second pin-receiving hole; and a solder connection on the non-abutting surface of the stiffening means, the solder connection mechanically attaching and electrically connecting the pin to the conductor on the non-abutting surface of the stiffening means.

15. The assembly of claim 14 wherein the conductor on the non-abutting surface of the stiffening means is a ground run for grounding the actuator arm.

16. The assembly of claim 15 wherein the solder connection is a solder build-up between the pin and the ground run.

17. The assembly of claim 16 further including a second solder build-up between the stiffening means and the flexible circuit, the second solder build-up mechanically attaching the stiffening means to the flexible circuit.

18. The assembly of claim 14 wherein the flexible circuit and the stiffening means further include respective first and second electrical contacts, with the first electrical contact abutting the second electrical contact.

19. The assembly of claim 14 wherein the electrically insulating material comprises a ceramic material.

20. The assembly of claim 14 wherein the second pin-receiving hole is sized to loosely receive the conductive pin.

21. The assembly of claim 20 wherein the first pin-receiving hole is sized to loosely receive the conductive pin.

22. The assembly of claim 14 including an adhesive attaching the abutting surface of the stiffening means to the flexible circuit and the flexible circuit abuts the actuator arm.

* * * * *

UNITED STATES PATENT AND TRADEMARK OFFICE
CERTIFICATE OF CORRECTION

PATENT NO. : 5,644,452

DATED : JULY 1, 1997

INVENTOR(S) : ALVIN E. COX, STEVEN S. ECKERD; DAVID S. ALLSUP, MARK S. MAGGIO

It is certified that error appears in the above-indentified patent and that said Letters Patent is hereby corrected as shown below:

Col. 7, line 28, after "circuit", insert --and--

Signed and Sealed this

Ninth Day of December, 1997

Attest:

Attesting Officer

BRUCE LEHMAN

Commissioner of Patents and Trademarks